United States Patent [19]
Susset

[11] 3,997,892
[45] Dec. 14, 1976

[54] DIGITAL TO ANALOG CONVERTER WITH IMPROVED COMPANDING

[75] Inventor: Dieter A. Susset, San Mateo, Calif.

[73] Assignee: TRW Inc., Los Angeles, Calif.

[22] Filed: Feb. 4, 1975

[21] Appl. No.: 546,867

Related U.S. Application Data

[63] Continuation of Ser. No. 383,268, July 27, 1973, abandoned.

[52] U.S. Cl. .................. 340/347 DA; 340/347 AD; 179/15 AV
[51] Int. Cl.² ....................................... H03K 13/02
[58] Field of Search ............ 340/347 DA, 347 AD; 179/15 AV; 325/38 R; 235/197

[56] References Cited
UNITED STATES PATENTS

| | | | |
|---|---|---|---|
| 3,298,014 | 1/1967 | Stephenson | 340/347 AD |
| 3,562,743 | 2/1971 | Le Rouge et al. | 340/347 DA |
| 3,573,795 | 4/1971 | Bowers et al. | 340/347 AD |
| 3,626,408 | 12/1971 | Carbrey | 340/347 AD |
| 3,646,548 | 2/1972 | Van Doren | 340/347 AD |

OTHER PUBLICATIONS

Gryzbowski et al., "Nonlinear Functions from D/A . . . ," Electronic Engineering, 7/1971, pp. 48–51.
Schmid, "Electronic Analog/Digital . . . ," Van Nostrand Reinhold Co., 1970, pp. 8–10.

Primary Examiner—Thomas J. Sloyan
Attorney, Agent, or Firm—Flehr, Hohbach, Test, Albritton & Herbert

[57] ABSTRACT

A digital to analog converter includes nonlinear and linear cascaded resistive voltage dividers the nonlinear divider having its resistors valued to approximate a desired transfer characteristic. The high order bits of the digital input code select a predetermined resistor of the nonlinear divider and place the voltage across such resistor across the linear resistive divider the lower order bits of the code thereafter selecting a point on the linear divider which provides an analog value equivalent to the digital input code.

6 Claims, 8 Drawing Figures $$Y = \frac{\ln(1+\mu x)}{\ln(1+\mu)}$$

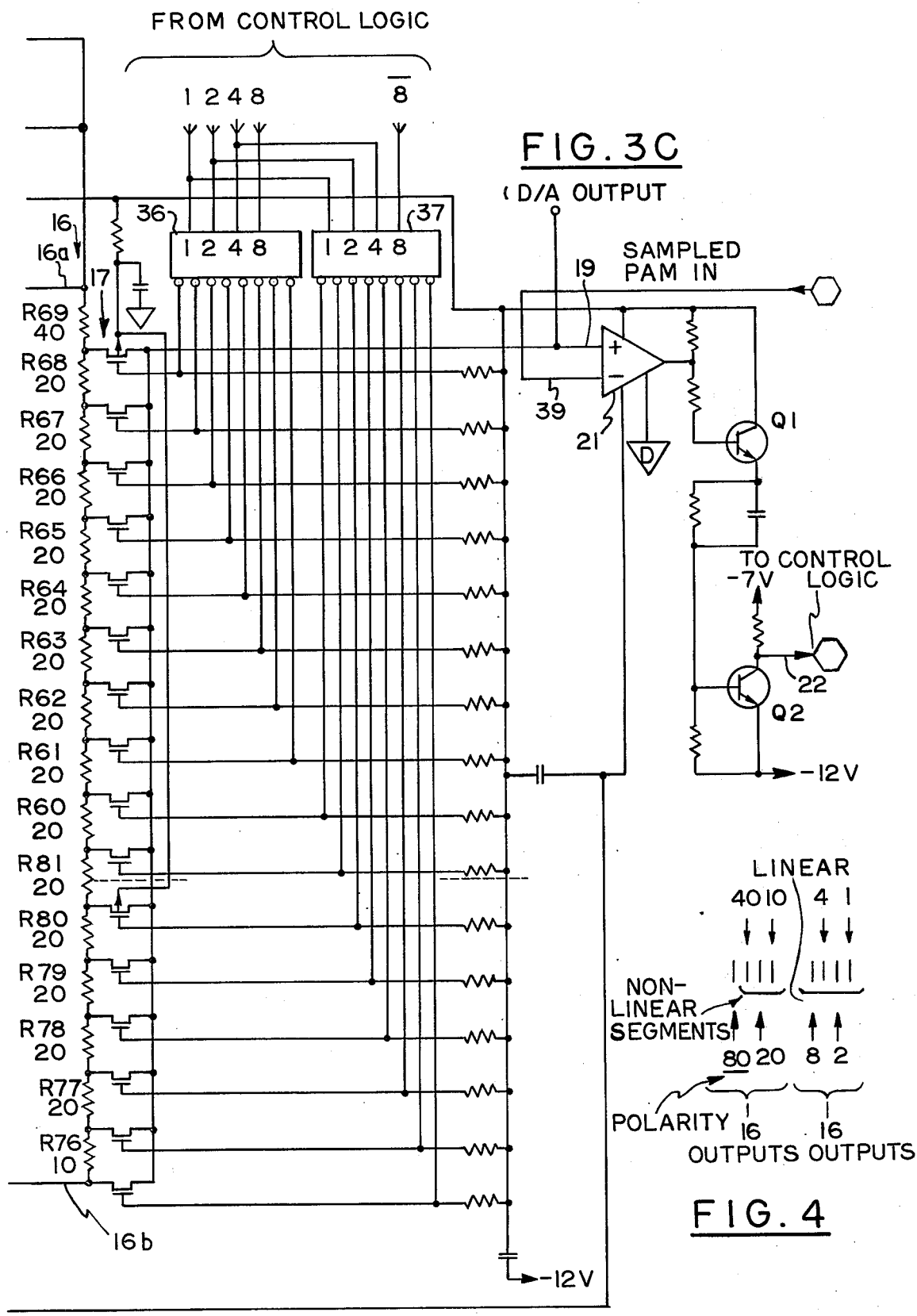

DIGITAL TO ANALOG CONVERTER WITH IMPROVED COMPANDING

This is a continuation, of application Ser. No. 383,268 filed July 27, 1973, abandoned.

BACKGROUND OF THE INVENTION

The present invention is directed to a digital to analog converter with improved companding.

In the telephone art in pulse code modulation (PCM) systems, digital to analog converters are required for converting to PCM from a sampled analog signal and thereafter reconverting back to an analog signal. A typical PCM signal consists of eight bits which represent 256 different amplitude levels.

During the above conversions, it is desirable to provide a standard companding characteristic to improve the signal to distortion ratio of speech. Past techniques have introduced excessive errors. In addition, any change in the companding characteristic was very difficult to make.

OBJECTS AND SUMMARY OF THE INVENTION

It is, therefore, a general object of the invention to provide an improved digital to analog (D/A) converter.

It is another object of the invention to provide a D/A converter which has improved companding.

In accordance with the above objects there is provided a digital to analog converter for converting a digital code having higher order bits and lower order bits to an analog value. A first resistive voltage divider has a plurality of resistors having values to approximate a desired transfer characteristic, each of the resistors corresponding to a unique digital number representing higher order bits. A second resistive voltage divider is also provided. First switching means connect a resistor of the first voltage divider corresponding to the higher order bits across the second voltage divider. Second switching means are responsive to the lower order bits for coupling an analog output terminal to a point on the voltage divider corresponding to the lower order bits.

BRIEF DESCRIPTION OF THE DRAWINGS

FIG. 4 is a chart useful in understanding FIGS. 3A – C.

DETAILED DESCRIPTION OF THE PREFERRED EMBODIMENT

Figure 1:
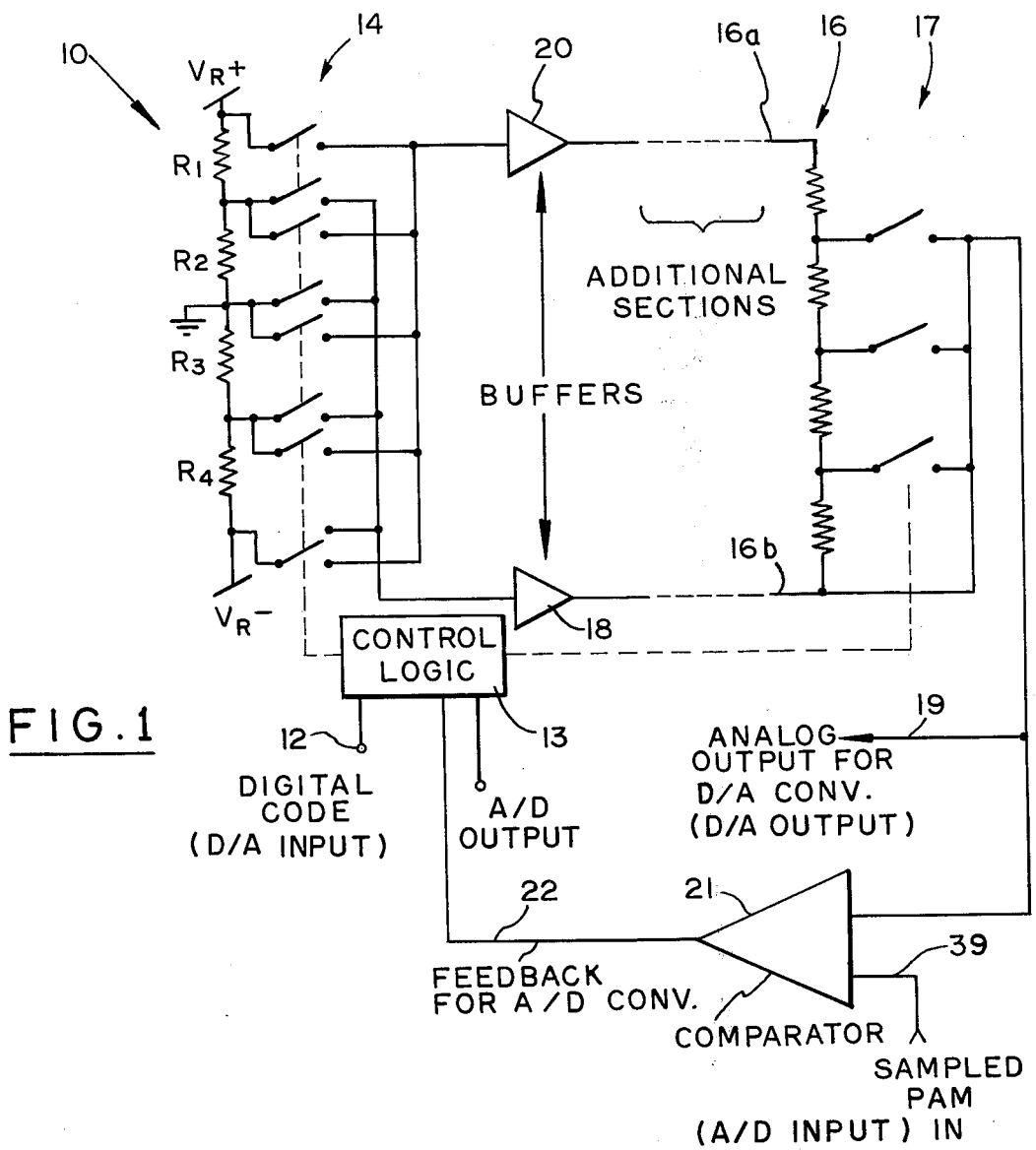
FIG. 1 is a simplified circuit diagram of a D/A converter embodying the present invention and also illustrates a corresponding A/D converter.

FIG. 1 illustrates the digital to analog converter of the present invention and also when such converter is used for analog to digital conversion. It includes a first resistor voltage divider 10 including the representative resistors $R_1$, $R_2$, $R_3$ and $R_4$ which have values to approximate a desired transfer characteristic as, for example, shown in FIG. 1B along with its associated formula. Such transfer characteristic is in fact the preferred one which is used in pulse code modulation telephone systems for reducing the above-mentioned signal to distortion ratio. Voltage divider 10 approximates the transfer characteristic where each resistor approximates a segment 11 of the transfer characteristic. In practice as will be discussed below, eight segments are used for the characteristic in the positive quadrant and eight segments approximate the characteristics in the negative quadrant. The division of such a characteristic into these segments is known in the art. Each of the resistors $R_1$ through $R_4$ corresponds to a unique digital number representing the higher order four bits of the eight bit pulse code modulation digital code shown at terminal 12. Thus, the higher order four bits are processed in the control logic unit 13 to actuate first switching means 14 to place a second resistive voltage divider 16 and specifically its points 16a and 16b across a selected resistor of voltage divider 10. The selected resistor corresponds to the upper four bits of the digital code on input 12. Points 16a and 16b are isolated from voltage divider 10 by the buffers 18 and 20. As indicated by the dashed lines connecting various switching pairs, a selected switching pair is operated to connect one end of a selected resistor $R_1 - R_4$ to buffer 20 and the other to buffer 18.

Second switching means 17 are provided which when actuated by control logic unit 13 are responsive to the four lower order bits of the digital code for coupling the analog output terminal 19 to a point on the resistive chain 16 corresponding to the particular lower order bits inputed at terminal 12. As indicated by the bracket coupling lines 16a and b of resistive voltage divider 16 additional sections for resistive voltage dividers can be provided to yield the desired transfer characteristic. With respect to the transfer characteristic of FIG. 1B only the first and second resistive voltage dividers 10 and 16 are necessary.

As specifically described thusfar, the circuit of FIG. 1 provides a digital to analog conversion where the digital input at 12 is converted to an analog signal at 19. The same circuit, however, can function as a analog to digital converter by the addition of the comparator 21 which has as one input a sampled pulse amplitude modulated (PAM) signal which, for example, would be an audio signal from a telephone line, which has been sampled and is compared in comparator 21 with the analog output of the digital to analog converter. This produces a feedback on line 22 to control logic unit 13 which when processed by the control logic 13 causes the appropriate switching units 14 and 17 to be actuated to cause a comparison to take place in comparator 21. The control logic has the capability of making successive approximations in a manner well known in the art.

Figure 1A:
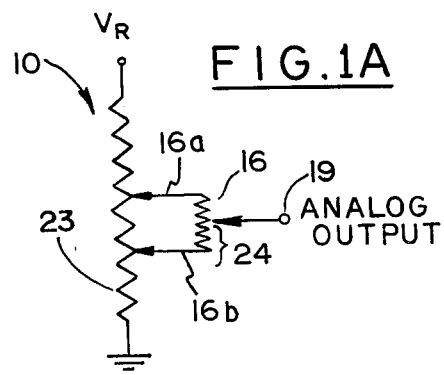
FIG. 1A is a simplified representation of FIG. 1.

FIG. 1A illustrates the circuit of FIG. 1 in more schematic form where resistive voltage dividers 10 and 16 are indicated; the lines 16a and 16b being across a selected portion of resistive voltage divider 10. In other words, the connection of a selected resistor by switch unit 14 to the buffers 18 and 20 in effect connects this resistor across divider 16 as indicated schematically in FIG. 1A and as will be explained below in greater detail in FIGS. 3A and 3B. Voltage divider 10 has applied to its two ends a positive reference voltage, VR+, and ground; it is therefore equivalent to the upper half of divider 10. Thus, the final analog output is a combination of two partial voltages; one across the portion 23 of resistive voltage divider 10 and a second partial voltage across the portion 24 of resistive voltage divider 16.

Figure 1B:
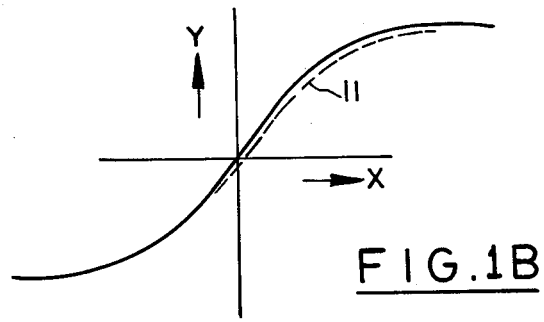
FIG. 1B shows the transfer characteristic of FIG. 1.
Figure 2:
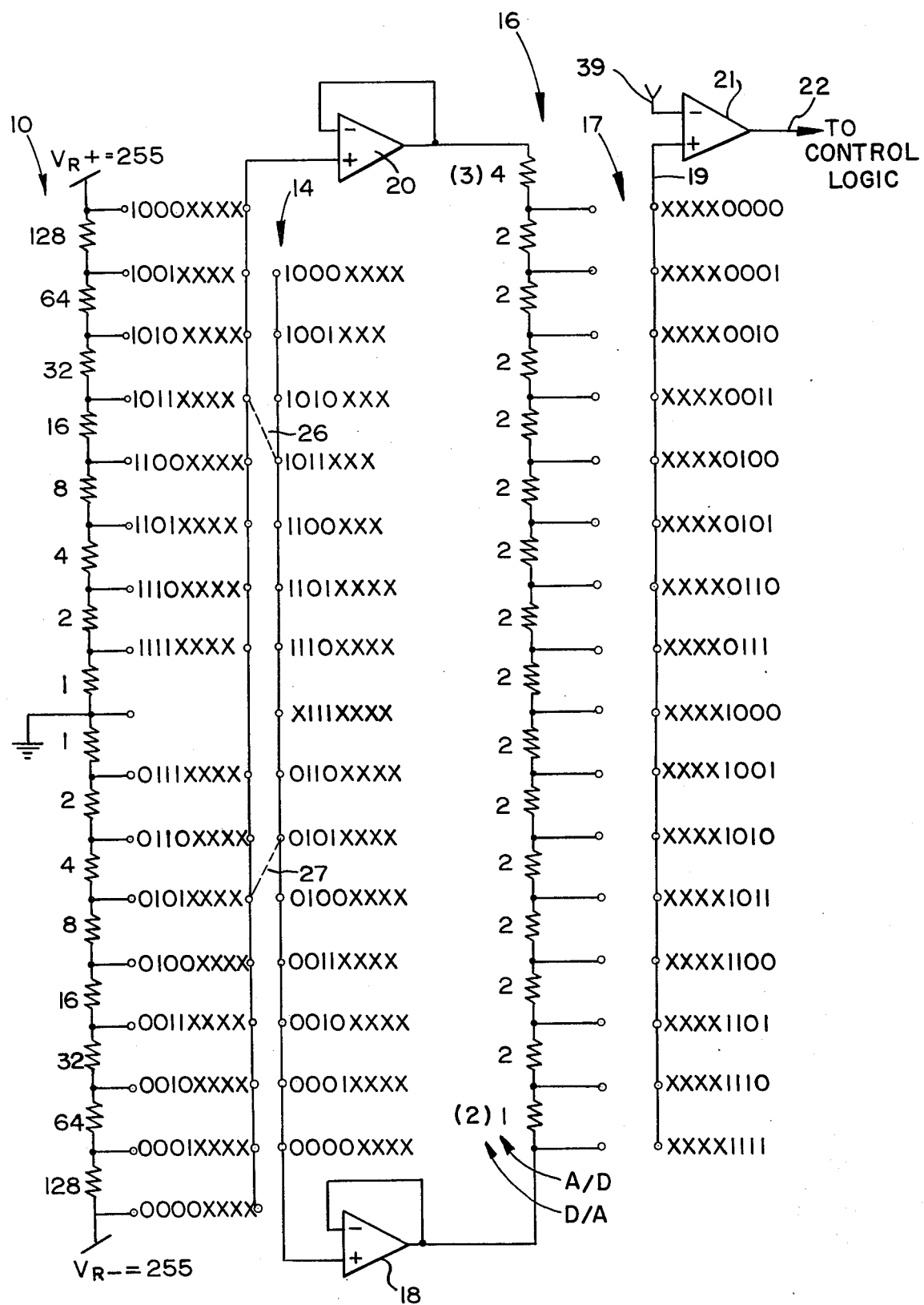
FIG. 2 is a more detailed circuit diagram of a portion of FIG. 1.

FIG. 2 illustrates in specific detail the resistive voltage dividers 10 and 16 each of which actually include 16 resistors which are indicated with their relative resistive values in order to achieve the characteristic of FIG. 1B. For example, in resistive voltage divider 10 the relative values of eight resistors range in an exponential manner from the center tap or ground going in both positive and negative directions between the VR+ and VR−. The bits necessary for switching resistor 16 are indicated, for example, by the two switching points designated 1011XXXX and coupled by the dashed line 26 to indicate a closure. Similarly, for a negative signal, the dashed line 27 indicates the closure of switches designated 0101XXXX to place the resistor having a value 4 between the inputs of buffers 20 and 18 or in other words, to place the ends of the voltage divider 16 across that resistor. Of course, only one of the above switch closures would occur at any one time. Similarly in the case of switching means 17, the indicated lower order four bits correspond to the digital code which will close that particular switch to thus connect the analog output terminal 19 to the appropriate point on voltage divider 16.

Figure 3A:
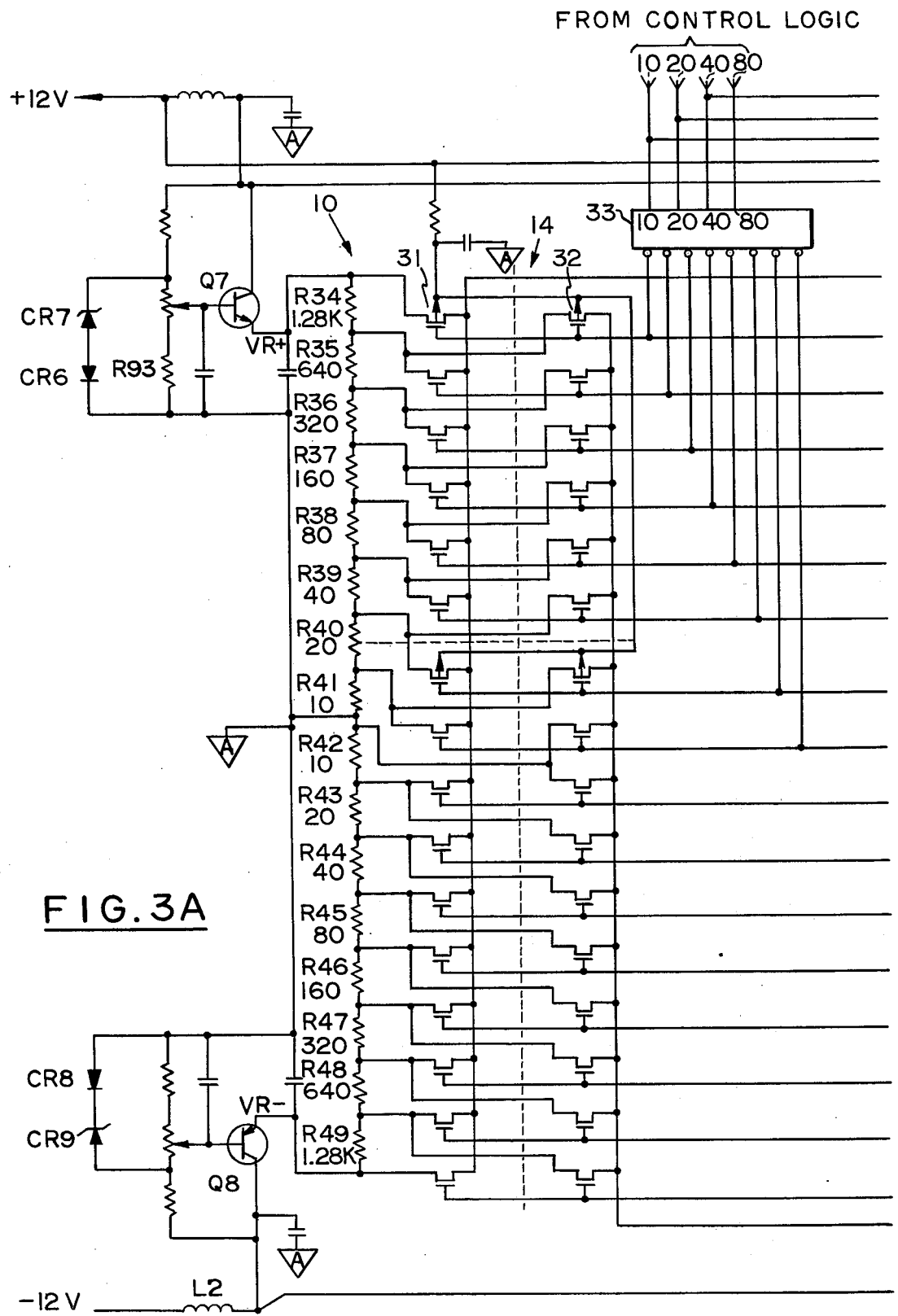
FIGS. 3A, B and C are a detailed circuit schematic of FIG. 2.
Figure 3B:
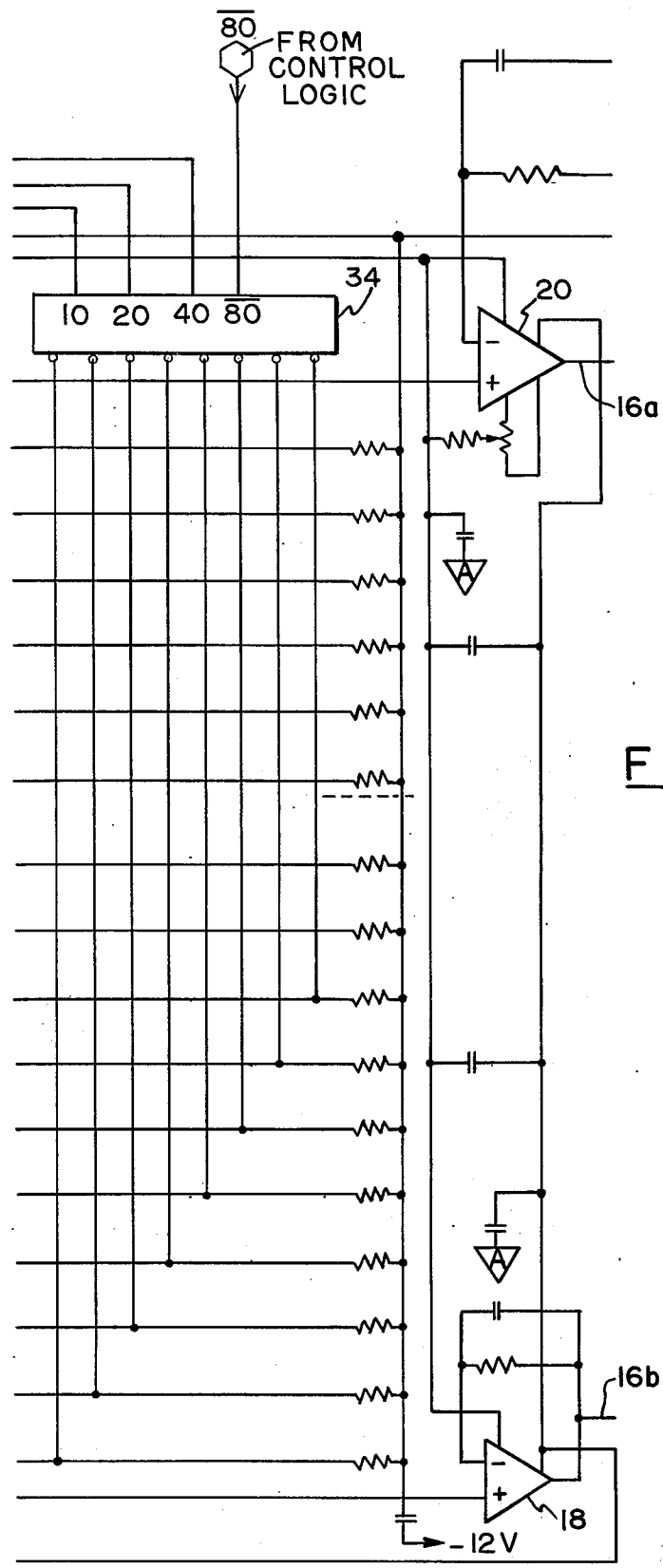

Now referring to FIGS. 3A, 3B and 3C which show in detail the circuit of FIG. 2, voltage divider 10 includes the resistors R34 through R49 along with their values in ohms. The constant voltage source VR+ is supplied by transistor Q7 and associated circuitry and VR− is supplied by transistor Q8 and associated circuitry. Switching means 14 include pairs of field effect transistors which are coupled across the respective individual resistors. For example, the first resistor R34 has one side coupled to the source terminal of field effect transistor 31 and the other side to the source terminal field effect transistor 32. The bases of these transistors are tied together and to an integrated decoding circuit 33 and 34. The circuits receive the four higher order bit inputs from the control logic unit indicated as 10, 20, 40 and 80. Circuit 34 also includes a $\overline{80}$ input of indicating polarity. These circuits are of a standard decoder type designated 7445. The combination of circuit 33 and 34 thus have 16 outputs; one for each of the resistors in voltage divider 10.

FIG. 4 illustrates the four bit input of 10, 40, 20, 80 where $\overline{80}$ is used for polarity and the other three are used bits for choosing the proper resistor or nonlinear segment of voltage divider 10. The selected resistor of the voltage divider and the voltage across it appears between buffer amplifiers 18 and 20 as shown in FIG. 3B. The outputs of these amplifiers are coupled across the voltage divider 16 on the end points 16a and 16b as illustrated in FIG. 3C. Voltage divider 16 includes resistors R60 through R69 and R76 through R81 along with their appropriate values in ohms. Except for the end resistors the values are the same to thus provide a linear network. Associated with each resistor in voltage divider 16 is a field effect transistor shown at 17. The 16 field effect transistors 17 are switched by integrated circuits 36 and 37 similar to circuits 33 and 34 and have as inputs the four lower order digital code bits designated 1, 2, 4, 8 and $\overline{8}$ from the control logic unit as illustrated in FIG. 1. Circuits 36 and 37 have 16 outputs each coupled to their respective gate inputs of the field effect transistors of switching unit 17. The logical switching of integrated circuits 36 and 37 is again shown in FIG. 4 where the 1, 2, 4 and 8 bits produce 16 outputs for the linear string of resistors.

The outputs of all field effect transistors are coupled together on output line 19 which provides the analog output of the digital to analog converter of the present invention.

Line 19 is also coupled to comparator amplifier 21 which receives as its other input the sampled PAM on line 39. This is fed back to the control logic unit for the purpose of A/D conversion through transistor buffer amplifiers Q1 and Q2 and then to line 22.

Thus to summarize the operation of voltage divider 10 and voltage divider 16 referring to FIG. 1B, a selection of a particular resistor of nonlinear voltage divider 10 selects, for example, a segment 11 of the transfer characteristic of FIG. 1B. The segment itself is linear and thus the linear voltage divider 16 locates the point on the segment 11, for example, which has the proper equivalent analog level to the digital code which as discussed above provides for 256 digital code levels; that is, 2 raised to the eighth power.

In conclusion, the present invention provides an improved D to A converter with a companding characteristic which may be easily modified. That is, the voltage divider 16 can have resistor values approximating any transfer characteristic desired. At the same time, the cascaded voltage dividers 10 and 16 do not in effect sum errors but any error in the system is maintained at a low but constant percent irrespective of the digital value being converted. Finally for more complex characteristics, additional sections similar to voltage divider 10 can be utilized.

I claim:

1. A digital to analog converter for converting a digital code having higer order bits and lower order bits to an analog value comprising: a first voltage divider having a plurality of resistors having values to approximate a desired transfer characteristic each of said resistors corresponding to a unique digital number representing said higher order bits; a second voltage divider having a plurality of series connected resistors of equal value; first switching means for connecting a resistor of said first voltage divider corresponding to the higher order bits across said second voltage divider; second single pole type switching means for coupling an analog output terminal to a point on said second voltage divider corresponding to said lower order bits; and decoding means responsive to said higher and lower order bits for providing control signals to said first and second switching means respectively.

2. A converter as in claim 1 together with means for applying a constant voltage across said first voltage divider.

3. A converter as in claim 1 where said switching means includes field effect transistors.

4. A converter as in claim 1 where said transfer characteristic is nonlinear and said second voltage divider has a substantially linear characteristic.

5. A converter as in claim 4 where the values of said resistors are chosen to provide said transfer characteristic of the form $$y = \frac{\ln(1 + \mu x)}{\ln(1 + \mu)}$$

6. A converter as in claim 1 where said first switching means includes buffer amplifiers for connecting said resistor of said first voltage divider to said second voltage divider.

* * * * *